United States Patent [19]

Tokunou et al.

[11] 4,045,731
[45] Aug. 30, 1977

[54] FILTER HAVING AN AUTOMATICALLY CONTROLLED VARIABLE CUT-OFF FREQUENCY

[75] Inventors: Takashi Tokunou; Shinichi Kouya; Shigeki Akatsuka, all of Gyoda, Japan

[73] Assignee: Takeda Riken Kogyo Kabushikikaisha, Tokyo, Japan

[21] Appl. No.: 649,124

[22] Filed: Jan. 14, 1976

Related U.S. Application Data

[62] Division of Ser. No. 525,807, Nov. 21, 1974, abandoned.

[51] Int. Cl.$^2$ .......................................... G01R 23/02
[52] U.S. Cl. ........................... 324/78 F; 324/77 E; 328/167; 330/129; 330/109; 330/149
[58] Field of Search ................. 324/77 E, 78 F; 328/167; 330/21, 29, 31, 35, 85, 86, 107, 109, 110, 145, 149

[56] References Cited

U.S. PATENT DOCUMENTS

| | | | |
|---|---|---|---|
| 3,297,882 | 1/1967 | Broadhead, Jr. ............... | 307/320 X |
| 3,665,345 | 5/1972 | Dolby ............................ | 330/149 X |
| 3,729,693 | 4/1973 | Dolby ............................ | 330/35 X |
| 3,839,673 | 10/1974 | Acker ............................ | 324/78 F X |
| 3,904,975 | 9/1975 | Satoh ............................ | 330/145 X |

*Primary Examiner*—Rudolph V. Rolinec
*Assistant Examiner*—Lawrence J. Dahl
*Attorney, Agent, or Firm*—Pollock, Vande Sande & Priddy

[57] ABSTRACT

A device for measuring the frequency or period of an input signal independent of different frequency noise signals which may be superimposed on the input signal includes a filter circuit having a variable cut-off frequency. The output level of the filter circuit is detected by a level detector, the output of which electrically controls a variable element such as a variable resistor, a variable capacitance diode or the like which is included in the filter circuit. This controls the cut-off frequency of the filter circuit, so as to maintain its output level at a given level. In this manner, an input signal frequency is converted into a corresponding level, utilizing a declining portion adjacent to the cut-off frequency of the frequency response of the filter circuit. The converted level is utilized to vary the cut-off frequency of the filter circuit to maintain its output level constant, thereby automatically changing the cut-off frequency in accordance with the input signal frequency.

9 Claims, 7 Drawing Figures

FILTER HAVING AN AUTOMATICALLY CONTROLLED VARIABLE CUT-OFF FREQUENCY

This is a division of application Ser. No. 525,807, filed Nov. 21, 1974, now abandoned.

BACKGROUND OF THE INVENTION

The invention relates to a filter having an automatically controlled variable cut-off frequency in which the cut-off frequency is automatically varied in accordance with an input signal frequency and in which the output is maintained at a predetermined constant level, and is more particularly concerned with a device for measuring the period or frequency of an input signal by use of such a filter.

Where it is desired to determine the period of an input signal, a gate signal may be derived from the input signal so as to correspond with one period thereof, and may be used to gate reference pulses supplied to a counter. If noises are superimposed on the input signal, there will result a change in the width of the one-period gate signal which is derived therefrom, causing an error in the determination of the period. The influence of such noises can be avoided by passing the input signal through a filter which eliminates frequencies higher than the frequency of the input signal before it is supplied to a period determining apparatus. However, the frequency of the input signal is unknown generally, which explains the need to determine its period, thus precluding a proper choice of the cut-off frequency of the filter which is used to eliminate the noises. In order to permit the use of a filter having a cut-off frequency which varies with the frequency of an input signal, it has been proposed to produce a pulse having a definite width defined by zero crossover points of the input signal, which pulse is rectified to convert the input signal frequency into a voltage level so that the voltage obtained may be compared against a plurality of reference voltages in order to permit a selection of one of filters having mutually different cut-off frequencies. The proposed arrangement requires a relatively complex frequency-to-voltage converter and also requires a number of filters which must be provided. A reduction in the number of filters may result in the failure to eliminate the noises.

It is an object of the invention to provide a filter having an automatically controlled variable cut-off frequency in which the cut-off frequency is automatically varied with the frequency of an input signal by using a simple arrangement.

It is another object of the invention to provide a filter having an automatically controlled variable cut-off frequency in which the cut-off frequency is automatically varied with an input signal frequency and the output level is maintained constant to facilitate the design of following circuitry.

It is a further object of the invention to provide a filter having an automatically controlled variable cut-off frequency in which the cut-off frequency is automatically varied with an input signal frequency and the output level is maintained constant, but can be changed.

It is an additional object of the invention to provide a filter having an automatically controlled variable cut-off frequency which can be used as a variable level regulator.

SUMMARY OF THE INVENTION

In accordance with the invention, there is provided a device for measuring the period or frequency of an input signal, comprising a filter circuit having a variable cut-off frequency which includes, as at least one of its components, a variable element having an electrical parameter the magnitude of which is controlled by an electrical signal. The cut-off frequency of the filter circuit is determined by the parameter value of this variable element, which may comprise a variable capacitance diode, a photoconductive element, a variable gain amplifier and the like. The output level of the filter circuit is detected by an output level detector, the output of which is supplied to the variable element as a control signal so as to maintain the output level of the filter circuit constant. the level detector may comprise a conventional detector. For example, in one embodiment in which the filter circuit is constructed as a low pass filter, an input signal having a frequency which is below the cut-off frequency of the filter will produce an output level of the filter circuit which is greater than the given level, and therefore the variable element will be controlled to decrease the cut-off frequency. Conversely, an input signal having a frequency which is higher than the cut-off frequency will produce an output level of the filter circuit which is below the given level, and in this instance the variable element will be controlled to increase the cut-off frequency. In this manner, the cut-off frequency of the filter circuit is automatically controlled in accordance with an input signal frequency, thereby enabling noises having higher frequency components to be eliminated. As a consequence, when the filter output is shaped to produce a gate signal having a duration corresponding to one period thereof, an accurate determination of the period is assured. Since the output level is maintained constant, the design of the subsequent circuit, such as a Schmidt trigger which may be used for wave shaping is facilitated. The variable element is controlled in accordance with a difference between the output level of the level detector and a reference voltage. By changing the value of the reference voltage, the output level of the filter circuit which is maintained constant can be changed.

DETAILED DESCRIPTION OF THE PREFERRED EMBODIMENTS

Figure 1:
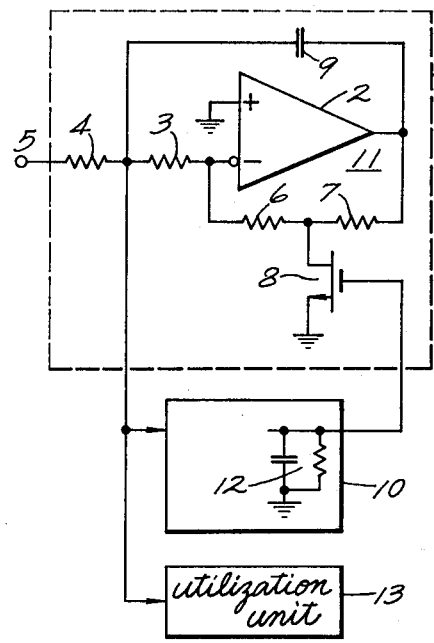
FIG. 1 is a block diagram of one embodiment of the filter according to the invention.
Figure 2:
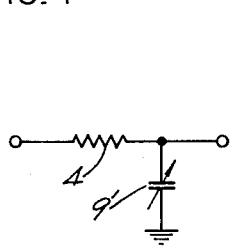
FIG. 2 is an equivalent circuit diagram of the circuit shown in FIG. 1.

Referring to FIG. 1, there is shown a filter circuit having a variable cut-off frequency, generally designated by reference numeral 1. In the embodiment shown, the filter circuit is constructed as a voltage controlled low pass CR filter. Specifically, an amplifier 2 has its noninverting input terminal connected to ground and has its inverting input terminal connected through a pair of resistors 3 and 4 with an input terminal 5. The output of the amplifier 2 is connected with the inverting input terminal through feedback resistors 6, 7. The junction between the resistors 6, 7 is connected to ground through a variable resistor which is formed by a field effect transistor 8. The resistance of the resistors 6, 7 as well as the resistance across the source and drain of the transistor 8 determine the gain of the amplifier 2, and thus these components constitute together a variable gain amplifier 11. A capacitor 9 is connected between the junction between the resistor 3, 4 and the output terminal of the amplifier 2. The resistor 4 and the capacitor 9 constitute together a low pass filter. The filter circuit 1 has an equivalent circuit as shown in FIG. 2, in which a capacitor 9' has a capacitance as expressed as (1 + A)C, wherein A represents the gain of the amplifiers 11 and C the capacitance of the capacitor 9. Representing the resistance of the resistor 4 by R, the cut-off frequency $f_c$ of the filter circuit 1 is given by the following equation:

$$f_c = \frac{1}{2\pi RC(1 + A)}$$

Thus, the cut off frequency $f_c$ varies as the gain A of the amplifier 11 is changed. The gain A is changed by controlling the resistance across the source and drain of the field effect transistor 8. Therefore, the variable gain amplifier 11 or transistor 8 can be considered as a variable element, the electrical parameter value of which is controlled by a control signal in order to determine the cut-off frequency of the filter circuit 1.

The output of the filter circuit 1 is supplied to a level detector 10, the output of which is applied across a parallel combination 12 of a capacitor and a resistor, and is also applied to the gate of the transistor 8. Thus, the resistance across the source and drain of the transistor 8 varies in accordance with the output from the detector 10. The output of the filter circuit 1 may be supplied to a utilization unit 13, for example, a wave shaper such as a Schmidt trigger circuit.

Figure 3:
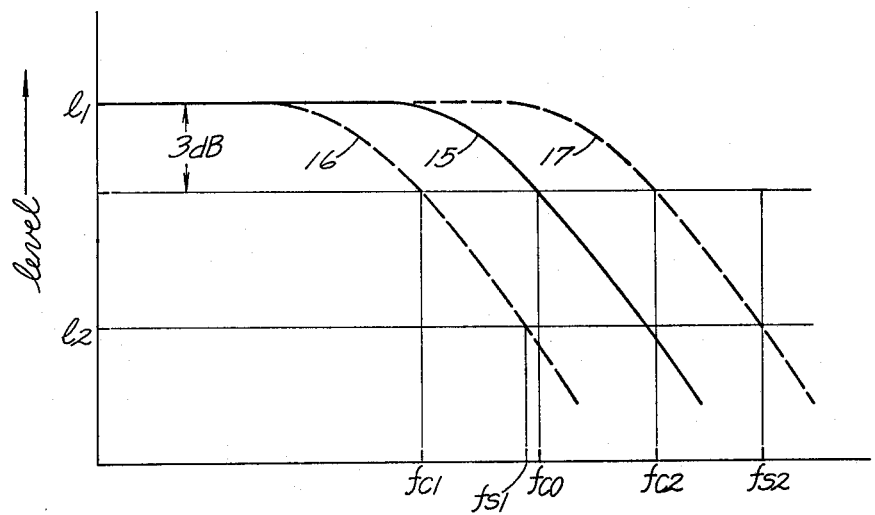
FIG. 3 graphically shows the frequency response of the filter shown in FIG. 1.

The filter circuit 1 may have a frequency response as represented by a curve 15 shown in FIG. 3. Assuming that an input signal has a level $l_1$ and the trigger level of the Schmidt trigger 13 is at a level $l_2$ which is lower than $l_1$, the overall system is arranged so that the output level of the filter circuit 1 is equal to $l_2$. If an input signal applied to the terminal 5 has a frequency $f_{s1}$ which is lower than the cut-off frequency $f_{c0}$ of the filter circuit 1, any noise having frequencies between $f_{s1}$ and $f_{c0}$ will be supplied to the circuit 13, assuming that the filter circuit 1 has a constant cut-off frequency. However, in the apparatus according to the invention, the output level of the filter circuit 1 is detected by a level detector 10, whereby a higher level $l_1$ than the given level $l_2$ can be detected. The detection output causes the drain current of the transistor 8 to be increased, thereby decreasing the resistance across the source and drain thereof and also decreasing the amount of feedback through the resistors 6, 7 to result in an increase in the gain A of the amplifier 11. As a consequence, the cut-off frequency $f_{c0}$ of the filter circuit 1 is lowered. This results in a shift of the curve 15 to the left on FIG. 3, with a resulting reduction in the output level of the filter circuit 1. When the level reaches $l_2$, the circuit becomes stable at that point. Under this condition, the response of the filter circuit 1 is represented by a curve 16 having a cut-off frequency $f_{c1}$.

Conversely, when an input signal has a frequency $f_{s2}$ which is higher than the cut-off frequency $f_{c0}$ of the filter circuit 1, this signal will be cut off by the filter circuit 1, whereby the output level of the filter circuit 1 will be reduced below the given value $l_2$. This results in a reduction in the resistance across the source and drain of the transistor 8 to reduce the gain A of the amplifier 11, thereby increasing the cut-off frequency of the filter circuit 1 so as to shift the response to the right on FIG. 3, as represented by a curve 17 having a cut-off frequency $f_{c2}$ at which an output level equal to $l_2$ is obtained. In this manner, the control is performed by utilizing a declining portion of the characteristic curve of the filter circuit 1 in a manner such that an input signal frequency is converted into a corresponding level, which is used to control the cut-off frequency of the filter circuit 1 so as to maintain the output signal level at the given value. By establishing a value for $l_2$ which satisfies the inequality $l_1 > l_2$, it is assured that any input frequency will lie on a point on the declining portion so that the damping characteristic of the declining portion of the characteristic curve causes a sharp attenuation of higher frequency components.

Thus, with the filter according to the invention, any noise components superimposed on an input signal and having higher frequencies can be eliminated irrespective of the frequency of the input signal. Thus, it may be utilized in the determination of the period of the input signal by a counter, by producing a gate signal which is precisely in correspondence with the period of the input signal so as to enable an accurate determination. As will be noted from the foregoing description, the detection of the output level of the filter circuit 1 may be carried out by a simple rectifier, and the control of the cut-off frequency of the filter circuit 1 can be accomplished in a simple manner as by control of the transistor 8. Since a single filter circuit 1 is used, the cut-off frequency of which is varied, the general arrangement is greatly simplified over the prior art practice where a plurality of filters are switched.

When the input signal frequency remains constant, but its level changes, the output level of the filter circuit 1 also changes, accompanying a corresponding change in the cut-off frequency $f_c$, thereby maintaining the output level constant. As a result, the signal level supplied to the circuit 13 remains constant, assuring a reliable operation of the circuit 13 and also facilitating the design of such circuit. In order to prevent an unstable operation of the transistor 8 when an input having an excessively high amplitude is applied, an amplitude limiter or AGC circuit may be used to limit the input signal to a definite level before it is supplied to the filter circuit 1. In this manner, it is assured that the cut-off frequency of the filter circuit 1 better follows the input signal frequency even with an input of higher amplitude.

Figure 4:
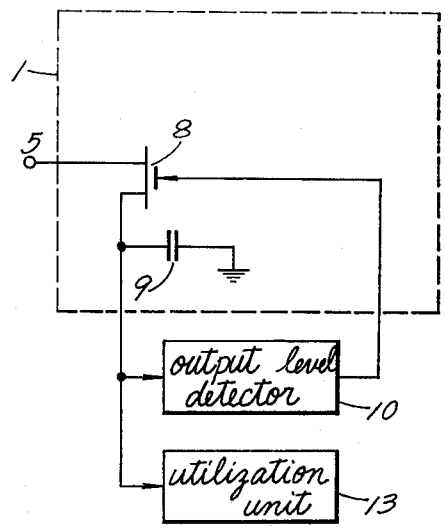
FIG. 4 is a block diagram of another embodiment of the filter according to the invention.

While in the above embodiment, the transistor 8 which functions as the gain controlling element is connected in shunt with the feedback path of the amplifier 11, it may be connected in series with the feedback path. Alternatively, in place of utilizing the Miller effect for the filter circuit 1, the filter circuit 1 may comprise a transistor 8 functioning as a variable resistor element which is connected in series in the signal path, and a capacitor 9 may be connected in shunt with the signal path, as shown in FIG. 4. As a further alternative, FIG.

Figure 5:
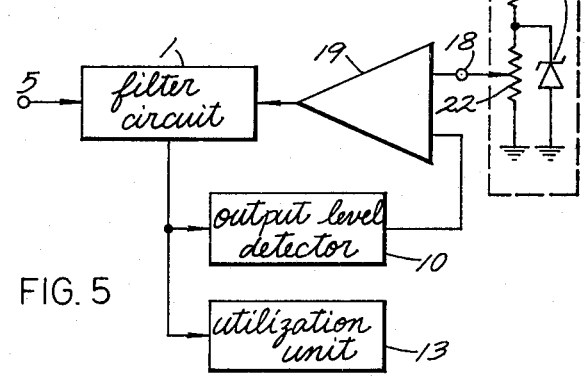
FIG. 5 is a block diagram of a further embodiment of the invention.

5 shows that the output from the detector 10 is compared against a reference voltage from a terminal 18 in a differential amplifier 19 so as to control the internal resistance of the transistor which is contained within the filter circuit 1 in accordance with a difference therebetween. Specifically, referring to FIG. 5, a source terminal 20 is connected through a resistor with a Zener diode 21, and the constant voltage thereacross is divided by a variable resistor 22 to constitute a reference voltage source 23. By adjusting the variable resistor 22 to change the reference voltage supplied to the terminal 18, the cut-off frequency of the filter circuit 1 can be automatically varied so that its output level becomes equal to any desired value chosen for the reference voltage level, again by utilizing the damping characteristic of the declining portion of the frequency response of the filter circuit 1. This is conveniently used to provide an optimum trigger level for the circuit 13 such as Schmidt trigger through the adjustment of the reference voltage when such circuit connected to the output of the filter circuit 1 has a different trigger level. Thus, the filter according to the invention can be used as a level regulator. Also in FIG. 5, a level regulator may be connected between the filter circuit 1 and the junction between the circuits 10 and 13, and in this instance, the reference voltage from the terminal 18 may be varied in accordance with a level change which results from the operation of the level regulator so as to modify the control signal to the variable element contained within the filter circuit 1.

Figure 6:
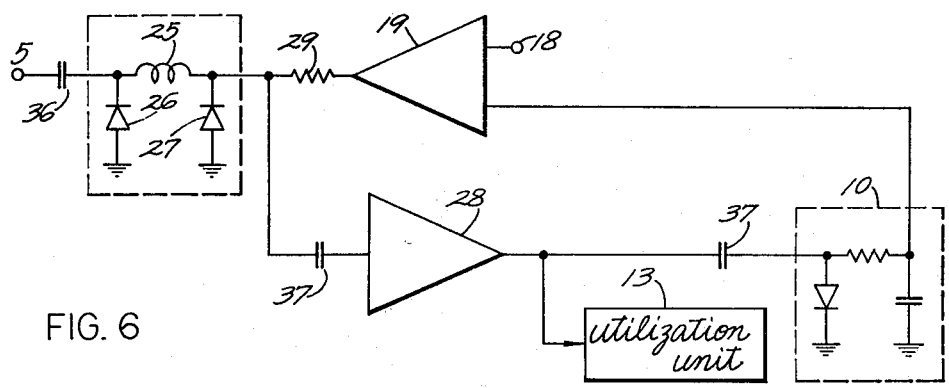
FIG. 6 is a circuit diagram of an additional embodiment of the filter according to the invention which is suitable for use with high frequency applications.
Figure 7:
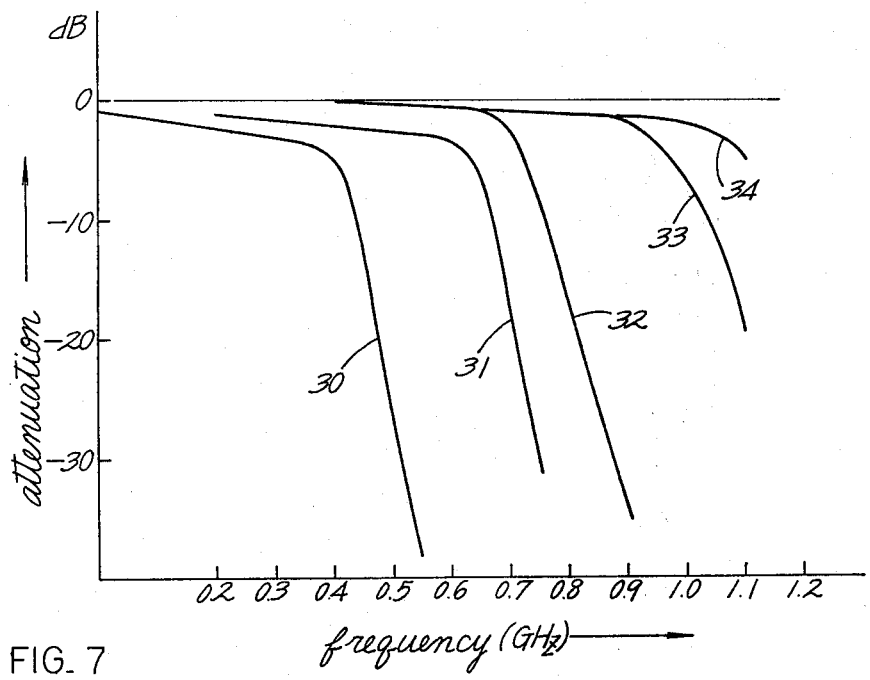
FIG. 7 graphically shows the frequency response of the filter shown in FIG. 6.

The embodiment shown in FIG. 1 is suitable for use with a relatively low frequency, and difficulties may be experienced when it is used with an input signal of a higher frequency range. A filter suitable for use with higher frequencies is illustrated in FIG. 6 wherein the filter circuit 1 comprises an inductance element 25 connected in series with the signal path, and a pair of variable capacitance diodes 26, 27 connected between the opposite ends of the inductance element and ground, these diodes functioning as variable elements. An amplifier 28 is connected between the filter circuit 1 and the junction between the circuits 10 and 13, and the reference voltage from the terminal 18 is chosen in accordance with the gain of the amplifier 28. The output of the differential amplifier 19 is supplied as a control signal to the variable capacitance diodes 26, 27 through a resistor 29. Numerals 36 and 37 represent d.c. blocking capacitors. In the practical embodiment constructed in accordance with FIG. 6, the inductance element 25 had a value of $5 \times 10^{-9}$ henry, and each of the variable capacitance diodes 26, 27 had a capacitance which varies from 2 pE to 20 pF. FIG. 7 shows the resulting frequency responses when the control voltage is varied from 0 to 15 volts, and it will be noted that a substantial control over the cut-off frequency is enabled. Curves 30, 31, 32, 33 and 34 shown in FIG. 7 correspond to the control voltages of 0, 3, 5, 10 and 15 volts applied to the diodes 26, 27.

In another practical embodiment which is constructed according to FIG. 1, the amplifier 2 comprises an operational amplifier LM 301A manufactured by National Semiconductor Corporation of the United States, the transistor 8 is of the type 2N4393 manufactured by the same company, and the resistors 3, 4, 6 and 7 have resistance values of 10 kΩ, 330Ω, 10 kΩ, and 22 kΩ, respectively, and the capacitor 9 has a capacitance of 0.047μF. The filter circuit 1 has a cut-off frequency of 15 Hz when the output voltage of the detector 10 is −0.039 volt, and has a cut-off frequency of 3 kHz when the output voltage of the detector 10 is −5.00 volt.

While the invention has been described as applied to low pass filters, it should be readily apparent that the invention is also applicable to a high pass filter. This may be achieved, for example, by interchanging the position of the variable element 8 and the capacitor 9 in the embodiment of FIG. 4, and by substituting a variable capacitance diode for the inductance element 25 and replacing the variable capacitance diodes 26, 27 by inductance elements in the embodiment of FIG. 6. It should be also appreciated that the invention is not limited to the types of filters illustrated, but may be applied to any other type of filters. Additionally, while the field effect transistor and variable capacitance diodes have been illustrated as the variable element 8, various other elements can be used. For example, a photoconductive element such as CdS may be used to have its resistance varied by a control of light impinging thereon, or a coil wound on a core may be supplied with a d.c. current in superposition with the input signal so as to control the magnetic permeability of the core to change the inductance of coil.

What is claimed is:

1. A measuring device for determining the period of an input signal independent of the frequencies of noise signals which may be superimposed on said input signal, comprising means for supplying the input signal whose period is to be measured to a filter apparatus which has an automatically controlled variable cut-off frequency, said filter apparatus comprising a filter circuit which includes a variable element the electrical parameter value of which may be controlled by application of an electrical control signal thereto, the cut-off frequency of said filter circuit being determined by the parameter value of said variable element and said filter circuit exhibiting a frequency cut-off characteristic having a declining portion; a level detector having its input connected to the output of said filter circuit for detecting a filtered output from said filter circuit the level of which varies with variations in the position of the frequency of the signal supplied to said filter circuit relative to the declining portion of the filter circuit cut-off characteristic due to the superimposition of differing frequency noise signals on the signal whose period is to be measured; means connected between the output of said detector and a control input of said variable element for supplying said detected level output as a control signal to said variable element thereby to control the cut-off frequency of said filter circuit in a manner operative to maintain said filtered output level at a given value; and a utilization circuit connected to the output of said filter circuit for receiving a filtered output of said input signal which has a level corresponding to said given value and from which noise signals having higher or lower frequencies than the frequency of the input signal are eliminated, said utilization circuit including means responsive to said filtered output for determining the period of said input signal.

2. A device according to claim 1 in which the filter circuit constitutes a variable CR filter circuit comprising a variable gain amplifier functioning as the variable element, a resistor connected to an input side of the amplifier, and a feedback capacitor connected across the input and output of the amplifier.

3. A device according to claim 1 wherein the variable element is connected in the feedback path of a variable gain amplifier for controlling the gain thereof.

4. A device according to claim 1, further including a source of a variable d.c. reference voltage, and a difference detection circuit for detecting a difference between the reference voltage and the output of the level detector to produce a control signal to the variable element in accordance with the difference.

5. a device according to claim 4 in which the reference voltage is controllable.

6. A device according to claim 1 in which the variable element comprises a variable capacitance diode.

7. A device according to claim 1 in which the device circuit comprises a variable capacitance diode functioning as a variable element, and an inductance element.

8. A device according to claim 1 in which the variable element comprises a field effect transistor, the resistance across the source and drain of the transistor being controlled.

9. A device according to claim 1 in which the filter circuit is constituted as a low pass filter circuit.

* * * * *